(12) United States Patent
Werle et al.

(10) Patent No.: US 8,643,381 B2
(45) Date of Patent: Feb. 4, 2014

(54) TEST ARRANGEMENT FOR AC VOLTAGE TESTING OF ELECTRICAL HIGH VOLTAGE COMPONENTS

(75) Inventors: Peter Werle, Walsrode (DE); Janusz Szczechowski, Leipzig (DE); Matthias Steiger, Schierau (DE)

(73) Assignee: ABB Technology AG, Zurich (CH)

( * ) Notice: Subject to any disclaimer, the term of this patent is extended or adjusted under 35 U.S.C. 154(b) by 332 days.

(21) Appl. No.: 12/963,941

(22) Filed: Dec. 9, 2010

(65) Prior Publication Data

US 2011/0121853 A1    May 26, 2011

Related U.S. Application Data

(63) Continuation of application No. PCT/EP2009/003756, filed on May 27, 2009.

(30) Foreign Application Priority Data

Jun. 12, 2008   (EP) ...................................... 08010691

(51) Int. Cl.
    *G01R 31/02*   (2006.01)
(52) U.S. Cl.
    CPC ................................... *G01R 31/021* (2013.01)
    USPC .......................................................... 324/543
(58) Field of Classification Search
    None
    See application file for complete search history.

(56) References Cited

U.S. PATENT DOCUMENTS

| | | | |
|---|---|---|---|
| 2,032,904 A | | 3/1936 | Bellaschi |
| 2,237,812 A | * | 4/1941 | De Blieux ..................... 361/603 |
| 2,551,841 A | | 5/1951 | Kepple et al. |
| 4,367,512 A | * | 1/1983 | Fujita ............................ 361/625 |
| 4,427,898 A | * | 1/1984 | Miyake et al. ................. 307/9.1 |
| 4,535,253 A | * | 8/1985 | Ootsuka et al. ................ 307/9.1 |
| 5,845,854 A | | 12/1998 | Adam et al. |
| 6,211,683 B1 | | 4/2001 | Wolf |
| 6,586,697 B1 | | 7/2003 | Enns |
| 7,394,171 B2 | | 7/2008 | Loppacher |

FOREIGN PATENT DOCUMENTS

| | | |
|---|---|---|
| AT | 330 887 | 7/1976 |
| AT | 330 887 B | 7/1976 |
| DE | 521 475 C | 3/1931 |
| DE | 1 563 442 | 4/1970 |
| DE | 23 28 375 A1 | 1/1975 |
| DE | 196 39 023 A1 | 3/1998 |

(Continued)

OTHER PUBLICATIONS

"Mobile on-site test system for off-line tests and diagnostics at power transformers" by Winter et al. 2006.*

(Continued)

*Primary Examiner* — Paresh Patel
(74) *Attorney, Agent, or Firm* — Buchanan Ingersoll & Rooney PC

(57) ABSTRACT

A test arrangement is provided for AC voltage testing of high voltage components including at least one inverter, at least one test transformer, at least one high-voltage inductor and at least one further high voltage component arranged as test components in a common cuboid container. The at least one high-voltage inductor is movable at least partially out of the container through at least one opening on a boundary surface of the container, by means of a movement apparatus. The at least one further high voltage component is movable within the cuboid container from a transport position to a working position.

22 Claims, 2 Drawing Sheets

(56) References Cited

FOREIGN PATENT DOCUMENTS

| DE | 20 2009 001 837 U1 | 5/2009 |
|---|---|---|
| EP | 2 133 704 A1 | 12/2009 |
| JP | 61102176 A | 5/1986 |
| SU | 1179234 | 9/1985 |
| WO | WO 2009/149866 A1 | 12/2009 |

OTHER PUBLICATIONS

International Search Report (PCT/ISA/210) issued on Nov. 3, 2009, by European Patent Office as the International Searching Authority for International Application No. PCT/EP/2009/003756.
European Search Report issued on Nov. 26, 2008 (with English translation of category of cited documents), (EP 2133704 A1).
A. Winter et al., "A Mobile Transformer Test System Based on a Static Frequency Converter", XVth International Symposium on High Voltage Engineering, Ljubljana, Slovenia, Aug. 27-31, 2007; T10-732; pp. 1-6, XP-002500564.
W. Schufft et al., "Frequency-Tuned Resonant Test Systems for On-Site Testing and Diagnostics of Extruded Cables", High Voltage Engineering Symposium, Aug. 22-27, 1999, vol. 5, No. 467, pp. 335-339, London, UK, XP-006501811.
Alexander Winter et al., "A New Generation of On-Site Test Systems for Power Transformers", IEEE International Symposium on Electrical Insulation, Jun. 9-12, 2008, pp. 478-482, Vancouver, Canada, XP-007906016.
S. Schierig et al., "HV AC Generation Based on Resonant Circuits With Variable Frequency for Testing of Electrical Power Equipment on Site", International Conference on Condition Monitoring and Diagnosis, Beijing, China, Apr. 21-24, 2008, pp. 684-691, Piscataway, U.S., XP-031292593.
T. Grun et al., "Equipment for On-Site Testing of HV Insulation", High Voltage Engineering Symposium, Aug. 22-27, 1999, pp. 240-243, London, UK, XP-006501801.
J. Lopez-Roldan et al., "Mobile Substations: Application, Engineering and Structural Dynamics", IEEE, Jan. 1, 2006, pp. 951-956, Piscataway, NJ, XP-031101946.
Jose Lopez-Roldan et al., "How to Achieve a Rapid Deployment of Mobile Substations and to Guarantee Its Integrity During Transport", IEEE Transactions on Power Delivery, vol. 23, No. 1, Jan. 2008, pp. 196-202, New York, New York, US, XP-011197613.

International Search Report (PCT/ISA/210) issued on Nov. 3, 2009, by European Patent Office as the International Searching Authority for International Application No. PCT/EP2009/003977.
International Search Report (PCT/ISA/210) issued on Oct. 23, 2009, by European Patent Office as the International Searching Authority for International Application No. PCT/EP2009/004001.
International Search Report (PCT/ISA/210) issued on Nov. 4, 2009, by European Patent Office as the International Searching Authority for International Application No. PCT/EP2009/003976.
International Search Report (PCT/ISA/210) issued on Nov. 9, 2009, by European Patent Office as the International Searching Authority for International Application No. PCT/EP2009/004048.
High Volt: "Tuneable Modular Reactors of High Power, Types DERI . . . M, G", Data Sheet No. 1.22/4, Apr. 1, 2007, 3 pages.
"Impulse Voltage Test System SGSA", Haefely High voltage Test, 2001, pp. 1-18, XP-009109093.
Klaus Schwenk et al., "Load Range Extension Methods for Lightning Impulse Testing With High Voltage Impulse Generators", 6 pages, May 2010.
M. Loppacker, "On-Site Impulse Tests and Corresponding State of the Art Measurement and Analysis Techniques for Power Transformers", Haefely High Voltage Test, 1999, 5 pages.
Alexander Winter et al., "A New Generation of On-Site Test Systems for Power Transformers", IEEE, Jun. 10, 2007, pp. 478-485.
Eklund et al., "Transformation vor Ort", ABB Technik Apr. 2007, pp. 45-48.
Eklund et al., "Increase transformer reliability and availability: From condition assessment to On-Site Repair", Power-Gen Middle East, Bahrain, 2007, pp. 1-17.
Data Sheet No. 1.22/2, "Tunable Modular, Reactors of High Power, Types DERI . . . M, G", High Volt, XP007910187.
Küchler, Prof. Dr.-Ing. Andreas, "Hochspannungstechnik", Springer, Verlag Bern Heidelberg 2005, p. 444.
Dissertation of Dipl-Ing. Florian Martin, "Hochspannungsprüfsystem auf Basis leistungselektronischer Frequenzkonverter", May 20, 2008, pp. 1-188.
Presentation for "Mobile on-site test system for off-line tests and diagnostics at power transformers", ABB, 2006, pp. 1-17.
Notice of Opposition filed in corresponding European Patent Application No. 2286254 on May 23, 2012.
Notice of Opposition filed in corresponding European Patent Application No. 2133888 on May 9, 2012.
Office Action dated Jun. 21, 2013 issued by the U.S. Patent and Trademark Office in corresponding U.S. Appl. No. 12/963,144.

* cited by examiner

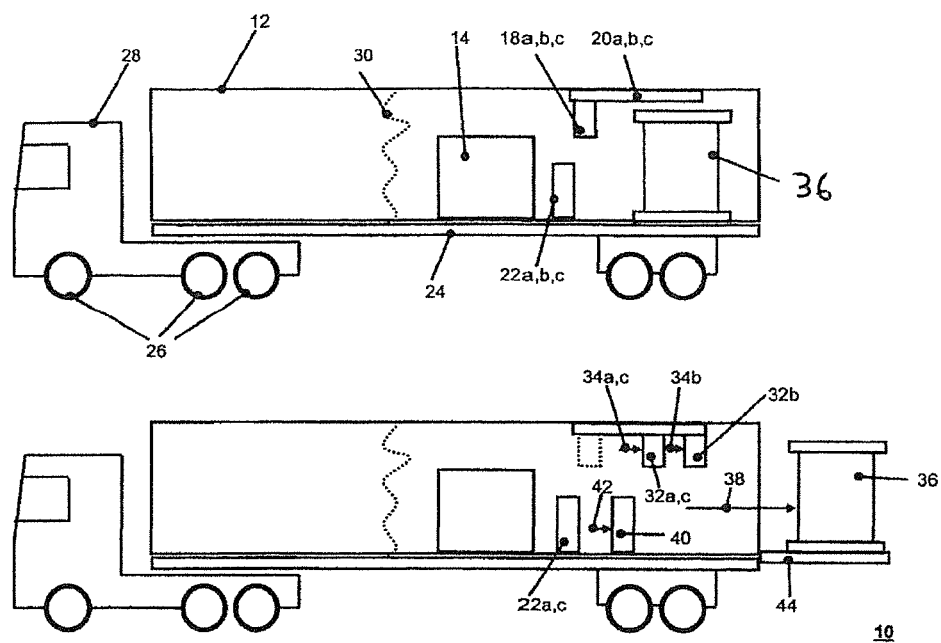
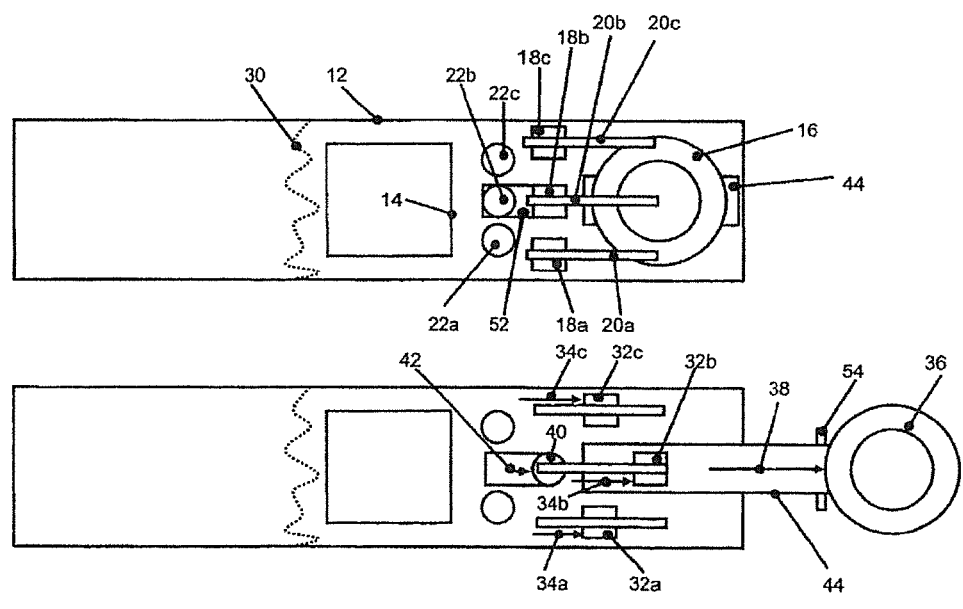
Fig. 1
Fig. 2

US 8,643,381 B2

TEST ARRANGEMENT FOR AC VOLTAGE TESTING OF ELECTRICAL HIGH VOLTAGE COMPONENTS

RELATED APPLICATION

This application claims priority as a continuation application under 35 U.S.C. §120 to PCT/EP2009/003756, which was filed as an International Application on May 27, 2009, designating the U.S., and which claims priority to European Application 08010691.7 filed in Europe on Jun. 12, 2008. The entire contents of these applications are hereby incorporated by reference in their entireties.

FIELD

The present disclosure relates to a test arrangement for AC voltage testing of electrical high-voltage components, such as at least one inverter, at least one test transformer, at least one high-voltage inductor, and at least one further high-voltage component arranged as test components in a common cuboid container.

BACKGROUND INFORMATION

It is generally known that high-voltage components, such as power transformers, are subject to an ageing process which can affect electrical insulation, for example. Tests, for example, on the power transformers, are therefore worthwhile at specific time intervals to ensure correct operation of an electrical power distribution system with components such as these. A test such as this is also required after the repair or servicing of a transformer. Tests such as these provide an indication of the state, for example, of the insulation and also allow the detection of other faults in the relevant component.

Components such as power transformers are very heavy, and may even be more than 100 tonnes, depending on the electrical rating. Because of the high transport cost for the respective power transformer, it is generally not worthwhile transporting a power transformer of this weight which has been installed within an electrical power distribution system, to a fixed-installed test panel in which it could be tested by means of an AC voltage test. Furthermore, there would need to be sufficient redundancy in a power distribution system to allow a power transformer to be removed for a relatively long time without adversely affecting the system operation.

For this reason, such AC voltage tests of power transformers are generally carried out in situ. The test arrangement with the AC voltage generator and further high-voltage components which are required for the test, such as high-voltage inductors, voltage dividers, and measurement apparatuses, as well as low-voltage components such as evaluation apparatuses, are transported in a plurality of assemblies to the site where the power transformer to be tested is located, and assembled there to form a test arrangement. The high-voltage inductor which is required to form a resonant circuit with the unit under test, for a resonance test, can represent a test component with a considerable size, because it has a height, for example, of 2.5 m and an internal diameter of, for example, 1 m. The voltage divider which is required to measure the high voltages of, for example, up to several 100 kV in the resonant circuit is also a high-voltage component with a similar height.

When carrying out an AC voltage test, care must be taken to ensure that the high-voltage components of the test arrangement are sufficiently far apart from one another, and are sufficiently far away from the adjacent ground potential, because of the high voltages which occur.

One disadvantage is that the assembly of the various assemblies on site involves a considerable amount of time. In particular, the positioning and assembly of a high-voltage inductor or of a voltage divider are highly time consuming.

Against this background, exemplary embodiments of the present disclosure provide a test arrangement which occupies less space and which can be transported easily.

SUMMARY

An exemplary embodiment provides a test arrangement for AC voltage testing of electrical high-voltage components. The exemplary test arrangement includes test components, which can include at least one inverter, at least one test transformer, at least one high-voltage inductor and at least one further high-voltage component. The exemplary test arrangement also includes a cuboid container in which the test components are commonly arranged. In addition, the exemplary test arrangement includes a movement apparatus configured to move the at least one high-voltage inductor at least partially out of the container, through at least one opening on a boundary surface of the container. The at least one further high-voltage component is configured to be moved within the cuboid container from a transport position to a working position.

BRIEF DESCRIPTION OF THE DRAWINGS

Additional refinements, advantages and features of the present disclosure are described in more detail below with reference to exemplary embodiments illustrated in the drawings, in which:

FIG. 1 shows a side view of an exemplary test arrangement according to an embodiment of the present disclosure;

FIG. 2 shows a plan view of an exemplary test arrangement according to an embodiment of the present disclosure.

Figure 3:
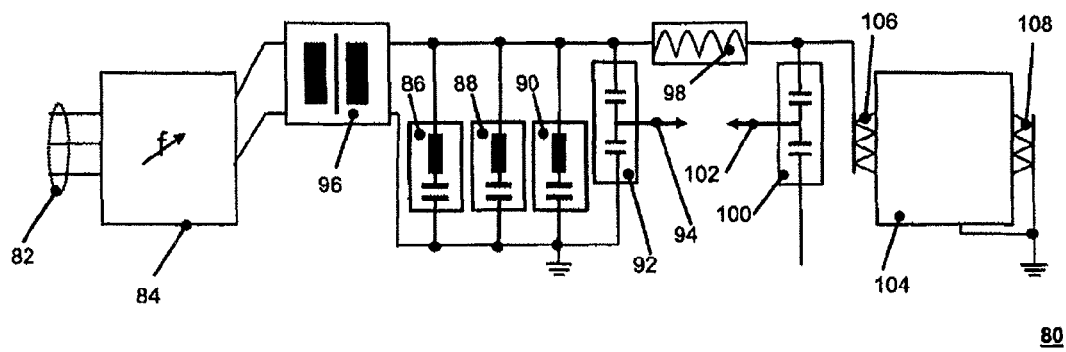
FIG. 3 shows an exemplary test circuit according to an embodiment of the present disclosure.

A summary of the reference symbols used in the drawings is provided in the list of reference symbols below.

DETAILED DESCRIPTION

Exemplary embodiments of the present disclosure provide a test arrangement for AC voltage testing of electrical high-voltage components arranged as test components in a common cuboid carrier. The test components can include, for example, at least one inverter, at least one test transformer, at least one high-voltage inductor, and at least one further high-voltage component. According to an exemplary embodiment, the at least one high-voltage inductor can be moved at least partially out of the container, through at least one opening on a boundary surface of the container, by means of a movement apparatus, and the at least one further high-voltage component can be moved within the cuboid container from a transport position to a working position.

The expression "high-voltage components" means those electrical components which can be electrically connected to one another in the test arrangement. By way of example, the high-voltage components can be elements of a resonant circuit such as inductance, capacitance or resistance, as well as any measurement apparatuses such as current transformers and voltage transformers, or else voltage dissipaters, which may be required for protection purposes. According to an exemplary embodiment of the present disclosure, the test arrangement need not necessarily be connected as a single-phase resonant circuit, but may also be connected as a three-phase test circuit for phase-by-phase testing of a unit under test such as a power transformer, but not as resonant circuits, and therefore at a lower voltage, for example of 110 kV. In this case, there would in each case have to be three of the high-voltage test components, including the inverter, the test transformer, which converts the voltage produced by the inverter to a higher voltage level, and the voltage transformers.

The isolation separations between the high-voltage inductor and further adjacent high-voltage components and/or the adjacent ground potential can advantageously be increased by the movement of the at least one further high-voltage component from a transport position to a working position. According to an exemplary embodiment of the test arrangement, a transport position is provided, in which the high-voltage inductor is arranged in a particularly space-saving manner within the container, and which makes it easy to transport the test arrangement. In addition, the high-voltage inductor can be arranged outside the container, in a working position, in which the isolation separations are increased, thus allowing operation of the arrangement or at least making it safer from the isolation point of view. The change between the arrangement positions can be achieved by the movement apparatus, for example a telescopic rail, in a simple form.

After the high-voltage inductor has been moved out of the container, free space is created within the container. According to an exemplary embodiment of the present disclosure, the free space can be used for rearrangement of selected further electrical high-voltage components of the test arrangement. This allows the test components to be arranged in a compact form when the test arrangement is being transported, without any need to consider isolation separations within the cuboid container in the transport position. When the test system is set up on site, the inductor can be first moved out of the container, for example. The free space that this results in can then be used for arranging further high-voltage components as necessary for isolation, governed by their respective working position.

On a case-by-case basis, it is, of course, also feasible for the space which is made available by moving the inductor out not necessarily to be used for rearrangement of the further high-voltage components, but for the further components, when in the transport position, to allow a free space in the interior of the freight container, which can then be used as a stowage area, for example for small components which are likewise required. When the test arrangement is being set up, the small components can be removed from the stowage area, and the further high-voltage components can be arranged as necessary for isolation.

The compact arrangement of the inductor and of the further high-voltage components within the container advantageously makes it simpler to transport the container and the test arrangement.

The at least one further high-voltage component can be an electrical filter element, for example. Filter elements such as these can be utilized to smooth the AC voltage which is produced by the inverter, that is to, to reduce the proportion of undesirable harmonics which, for example, would influence a partial-discharge (PD) measurement. A filter element generally has an inductance and a capacitance, but filter element modules with only a capacitance or inductance are also feasible. In addition, a plurality of filter elements and/or filter element modules can be connected to form a filter. In filter elements such as these, care must likewise be taken to ensure an adequate isolation separation from other high-voltage components.

In accordance with an exemplary embodiment of the test arrangement, the at least one further high-voltage component can be a voltage transformer, for example. This is also a high-voltage component which requires an increased isolation separation during operation.

In accordance with an exemplary embodiment of the test arrangement according to the present disclosure, the at least one further high-voltage component can be moved by means of a guide apparatus. In particular, this simplifies a movement process from the transport position to the working position.

In accordance with an exemplary embodiment of the present disclosure, the at least one further high-voltage component can be moved along a guide rail. In the same way as the movement according to exemplary embodiments of the present disclosure of the at least one further high-voltage component, this allows movement between the transport position and the working position, with accurate positions being maintained and which is at the same time safe, by means of a pivoting apparatus.

According to an exemplary embodiment of the test arrangement, the at least one further high-voltage component can be locked in the transport position and/or in the working position. This improves safety during transport and, during test operation, by ensuring that the test components are positioned correctly and safely. By way of example, such locking can be achieved by means of a screw-type clamping connection and/or a locking mechanism with a snap-action apparatus.

In accordance with an exemplary embodiment of the test arrangement according to the present disclosure, the at least one further high-voltage component can be fitted and guided in the upper area of the cuboid container, for example suspended from the ceiling. This exemplary feature makes it possible to provide the space on the floor of the container during transport as a stowage area for small parts that are required, or else to arrange further high-voltage components upright on the floor of the container. The space available in the container is in this way largely made use of.

According to an exemplary embodiment, the electrical connecting lines to the at least one further high-voltage component can be fitted in the upper area of the cuboid container. These lines can be designed such that the further high-voltage components connected to them are reached by the lines, both in the transport position and in the working position, without any additional connection process. This can be achieved, for example, by loop guidance of a flexible line. The routing of the lines in the ceiling area also reduces the risk of accidents to operating personnel who are moving on the container floor when setting up the test arrangement on site.

According to an exemplary embodiment, the connecting lines are cables, which are sheathed by an insulation layer. When insulated cables such as these are arranged within the cuboid container, there is generally no need to pay attention to isolation separations between the cables and grounded objects, further simplifying the arrangement.

In accordance with an exemplary embodiment of the test arrangement, the guide apparatus for the at least one further high-voltage component has a drive (e.g., a drive mechanism), such as a spindle drive with an electric motor or a hydraulic drive, for example. This further simplifies the movement from the transport position to the working position and back.

The space available in the container is utilized particularly well according to exemplary embodiments of the present disclosure if the working position of the at least one further high-voltage component at least partially intersects an area of the inductor which has not been moved out.

In accordance with an exemplary embodiment of the test arrangement, a voltage divider can be moved, together with the high-voltage inductor, out of the cuboid container. The movement of a voltage divider out of the internal area of the cuboid container as well creates more space in the container in the working position, as a result of which the test components which still remain in the container can be moved with respect to one another, once again increasing the isolation separation.

In order to produce a safe isolation separation between the high-voltage inductor that has been moved out and the voltage divider which is moved out with it, an exemplary embodiment of the present disclosure provides for the voltage divider to be moved to an isolation position, away from the high-voltage inductor, when the high-voltage inductor is moved out, by means of a further movement apparatus. The high-voltage inductor and the voltage divider can, for example, always be aligned along parallel axes.

In this context, the container can be in the form of a freight container with predetermined dimensions (e.g., standard dimensions in a particular field), such as a freight container with a length of 40 feet, for example. In accordance with an exemplary embodiment, the container can be constructed and/or licensed in accordance with the CSC (Container Safety Convention), and can therefore be placed in any desired position within a container stack on a container ship, for example. This even further enhances the transportability of the test arrangement.

In accordance with an exemplary embodiment, the at least one opening in the container can advantageously be closed. When the container is being transported with the openings closed, the high-voltage components of the test arrangement located in the container are therefore better protected.

FIG. 1 shows a side view 10 of an exemplary test arrangement, in a transport position in the upper part of the drawing, and in a working position in the lower part of the drawing. A cuboid container 12, for example, a freight container with predetermined dimensions (e.g., standard dimensions in a particular field), is positioned on a goods-vehicle trailer 24, which rests on a goods vehicle 28, e.g., a 3-axle semi-trailer. In the example of FIG. 1, a test arrangement is located in the freight container 12, although only selected test components of this test arrangement are shown. In particular, further moving test components are shown, in addition to a test transformer 14, which is mounted firmly in the freight container 12.

A high-voltage inductor 36, which arranged on and moved by a movement apparatus 44, is shown in the retracted state, in the upper part of the example of FIG. 1, in a transport position within the boundaries of the freight container 12. Three filter elements 18a, 18b and 18c are indicated in the transport position, suspended from the ceiling of the freight container 12 and mounted on a respective guide apparatus 20a, 20b and 20c. In the example of FIG. 1, the guide apparatuses 20a, 20b and 20c are each hollow rails along which the respective filter elements can be moved via an apparatus which is similar to a hook, although only the first guide apparatus 20a is shown in FIG. 1, while the other two guide apparatuses 20b and 20c are concealed. The filter elements 18a, 18b and 18c can be locked by means of a locking apparatus, at least in the transport position shown at the top and in the working position shown at the bottom. According to an exemplary embodiment, the locking apparatus can be, for example, a screw-type clamping connection and/or a locking mechanism with a snap-action apparatus. The filter elements 18a, 18b and 18c are electrically connected by insulated cables from the ceiling of the freight container 12.

It is not only feasible for the filter elements 18a, 18b and 18c to be permanently connected to the respective cables in both positions, but it is likewise feasible for the cable connection to be a plug-in connection. This is particularly advantageous when the test arrangement is matched to the local conditions, the frequency of the AC voltage that is produced, and/or to the unit under test. Depending on the situation, it is also possible to connect only selected filter element(s), which, for example, are each matched to a specific filter frequency.

Three voltage transformers 22a, 22b, 22c are indicated in the transport position on the floor of the freight container 12, although only the first voltage transformer 22a can be seen here, because the view is from the side. When the test components are in the transport position, the internal space available in the freight container 12 is utilized to a large extent by the arrangement, vertically one above the other, of the filter elements 18a, 18b and 18c, which are suspended from the ceiling, and the voltage transformers 22a, 22b and 22c, which are positioned upright on the freight container floor.

The lower part of FIG. 1 shows the same test arrangement, but with the test components now being in a working position. The high-voltage inductor 36 is now shown in the working position on the extended movement apparatus 44, whose movement direction is indicated by the arrow 38. All three filter elements which are suspended from the ceiling have likewise been moved into a rear area in the freight container along their respective guide apparatus 20a, 20b and 20c in the direction of the respective arrows 34a, 34b and 34c to a respective working position 32a, 32b and 32c. The electrical isolation separations between the filter elements in the working positions 32a, 32b and 32c and the voltage transformers, which are now likewise located in the working positions 22a, 22c and 40, are sufficiently great to allow the test arrangement to be operated safely from the isolation point of view.

FIG. 2 shows a plan view 50 of a comparable exemplary test arrangement. With the exception of the goods vehicle, the illustrated test arrangement is identical to the corresponding test components, even with respect to the reference symbols that are used. One additionally illustrated component in comparison to FIG. 1 is an extendable support 54 underneath the extended movement apparatus 44 for the high-voltage inductor 36 in the working position. This is used to cope with the movement of the center of gravity of the cuboid container 12, which results from the extended high-voltage inductor, and to ensure that the test arrangement is positioned safely, particularly when it also remains on a goods-vehicle trailer during the test phase.

FIG. 2 shows a plan view 50 of a comparable exemplary test arrangement. With the exception of the goods vehicle, the illustrated test arrangement is identical to the corresponding test components, even with respect to the reference symbols that are used. One additionally illustrated component in comparison to FIG. 1 is an extendable support 54 underneath the extended movement apparatus 44 for the high-voltage inductor in the working position 36. This is used to cope with the movement of the center of gravity of the cuboid container 12, which results from the extended high-voltage inductor, and to ensure that the test arrangement is positioned safely, particularly when it also remains on a goods-vehicle trailer during the test phase.

A further component which can now be seen is the guide apparatus 52 for the second voltage transformer, which is shown in the transport position 22b in the upper illustration, and in a working position 40 in the lower illustration. According to an exemplary embodiment, the guide apparatus 52 can be a guide rail which is incorporated in the floor of the freight container and driven by means of an electric motor and a chain, for example. According to an exemplary embodiment, the adjacent voltage transformers 22a and 22c are mounted in a fixed form, that is, they have no guide apparatuses whatsoever.

FIG. 2 also shows all the filter elements 18a, 18b and 18c in the transport position, with the reference symbols 32a, 32b and 32c illustrating the working position, as well as the associated guide apparatuses 20a, 20b and 20c. These components were partially concealed in FIG. 1, because of the side view illustrated there, and therefore cannot be seen. This illustration shows well that the distance between the electrical high-voltage components is very short in the illustration shown in the upper part of the drawing, thus making good use of the volume available in the freight container 12. In contrast, in the lower part of the drawing, the high-voltage components have been moved considerably away from one another in their respective working position, thus creating a sufficiently great isolation separation between the high-voltage components during operation of the test arrangement.

It is, of course, possible, and in contrast to the illustration shown in FIG. 2, for the guide apparatuses 20a, 20b and 20c also to be arranged in the lateral direction with respect to the longitudinal extent of the freight container, such that, in their respective transport position, they are located on a side wall of the freight container and are moved as appropriate to their respective working position in the central freight container area. In this variation, the filter elements 18a, 18b and 18c can advantageously be fixed in their transport position on a side wall of the freight container, for example by straps.

FIG. 3 shows an electrical overview circuit diagram 80 of an exemplary test circuit, e.g., a resonant circuit, to which some of the test components can be connected for tests at particularly high voltages. A resonant circuit such as this has one phase, that is to say only one phase of the test components, some of which are indicated in FIG. 1 as being three-phase components, is in each case used in this arrangement.

An inverter 84 has a three-phase connection via its inputs 82 to a voltage supply on site, for example 400 V, 50 Hz. During operation, a regulated AC voltage is produced at the outputs of the inverter 84, which are connected to the connections of the low-voltage side of a second test transformer 96. The transformed voltage at the top of the second test transformer 96 is smoothed by the filter elements 86, 88, 90. The total of three filter elements is illustrated only schematically here, although a greater number of filter elements are, of course, feasible. The filter elements can each be designed for different frequencies, thus allowing the respective constraints on the high-voltage test to be taken into account by selection and connection of suitable filter elements, in which case, of course, filter elements which are present may remain unused, as appropriate. A voltage transformer 92 is connected electrically in parallel with the filter elements 86, 88, 90 and measures the AC voltage produced by the inverter 84 and the AC voltage transformed by the test transformer 96, and supplies these via a voltage tap 94 to the control apparatus for the inverter 84.

The frequency of the AC voltage is regulated such that the resonant circuit is excited at its resonant frequency. The resonant circuit can have a second high-voltage inductor 98, a unit under test 104 and a capacitive voltage divider 100. The high-voltage components are matched to one another so as to produce a resonant frequency somewhat above the normal mains frequency of 50 Hz, for example 70 Hz-150 Hz, with this frequency depending on the characteristic data of the unit under test to be tested. The unit under test 104 in the illustrated example is a three-phase power transformer, whose connections 108 on the low-voltage side are each connected to ground, and whose connections 106 on the high-voltage side are connected electrically in parallel with one another in the resonant circuit.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

10 Side view of an exemplary test arrangement
12 Cuboid container
14 Test transformer
18a First filter element in the transport position
18b Second filter element in the transport position
18c Third filter element in the transport position
20a Guide apparatus for the first filter element
20b Guide apparatus for the second filter element
20c Guide apparatus for the third filter element
22a First voltage transformer
22b Second voltage transformer in the transport position
22c Third voltage transformer (concealed)
24 Goods-vehicle trailer
25 Wheels
28 Goods vehicle
30 Boundary line
32a First filter element in the working position
32b Second filter element in the working position
32c Third filter element in the working position
34a Movement direction of the first filter element
34b Movement direction of the second filter element
34c Movement direction of the third filter element
38 Movement direction of the high-voltage inductor
40 Second voltage transformer in the working position
42 Movement direction of the second voltage transformer
44 Movement apparatus for the first high-voltage inductor
50 Plan view of an exemplary test arrangement
52 Guide apparatus for the second voltage transformer
54 Extendable support
80 Exemplary test circuit
82 3-phase connecting line
84 Inverter

What is claimed is:

1. A test arrangement for AC voltage testing of electrical high-voltage components, the test arrangement comprising:
   test components including at least one inverter, at least one test transformer, at least one high-voltage inductor and at least one further high-voltage component;
   a cuboid container in which the test components are commonly arranged;
   a movement apparatus configured to move the at least one high-voltage inductor at least partially out of the container, through at least one opening on a boundary surface of the container,
   wherein the at least one further high-voltage component is configured to be moved within the cuboid container from a transport position to a working position, and
   wherein the at least one further high-voltage component is fitted and guided in an upper area of the cuboid container.

2. The test arrangement as claimed in claim 1, wherein the at least one further high-voltage component is an electrical filter element.

3. The test arrangement as claimed in claim 1, wherein the at least one further high-voltage component is a voltage transformer.

4. The test arrangement as claimed in claim 1, comprising:
   a guide apparatus configured to move the at least one further high-voltage component.

5. The test arrangement as claimed in claim 1, wherein the container comprises a guide rail configured to move the at least one further high-voltage component thereon.

6. A test arrangement for AC voltage testing of electrical high-voltage components, the test arrangement comprising:
   test components including at least one inverter, at least one test transformer, at least one high-voltage inductor and at least one further high-voltage component;
   a cuboid container in which the test components are commonly arranged;
   a movement apparatus configured to move the at least one high-voltage inductor at least partially out of the container, through at least one opening on a boundary surface of the container,
   wherein the at least one further high-voltage component is configured to be moved within the cuboid container from a transport position to a working position, and
   wherein the at least one further high-voltage component is configured to be pivoted about a rotation axis.

7. The test arrangement as claimed in claim 1, comprising:
   a locking mechanism configured to lock the at least one further high-voltage component in at least one of the transport position and the working position.

8. A test arrangement for AC voltage testing of electrical high-voltage components, the test arrangement comprising:
   test components including at least one inverter, at least one test transformer, at least one high-voltage inductor and at least one further high-voltage component;
   a cuboid container in which the test components are commonly arranged;
   a movement apparatus configured to move the at least one high-voltage inductor at least partially out of the container, through at least one opening on a boundary surface of the container,
   wherein the at least one further high-voltage component is configured to be moved within the cuboid container from a transport position to a working position, and
   electrical connecting lines connected to the at least one further high-voltage component and fitted in an upper area of the cuboid container.

9. The test arrangement as claimed in claim 8, wherein the connecting lines are cables which are sheathed by an insulation layer.

10. The test arrangement as claimed in claim 4, wherein the guide apparatus for the at least one further high-voltage component has a drive mechanism.

11. The test arrangement as claimed in claim 1, wherein the working position of the at least one further high-voltage component at least partially intersects an area of the inductor which has not been moved out of the container.

12. The test arrangement as claimed in claim 1, wherein the movement apparatus is configured to move a voltage divider, together with the high-voltage inductor, out of the cuboid container.

13. The test arrangement as claimed in claim 12, comprising:
   a further movement apparatus configured to move the voltage divider relative to the high-voltage inductor.

14. The test arrangement as claimed in claim 1, wherein the cuboid container is a transportable freight container with predetermined dimensions.

15. The test arrangement as claimed in claim 1, wherein the at least one opening is closeable.

16. The test arrangement as claimed in claim 6, comprising:
   a guide apparatus configured to move the at least one further high-voltage component.

17. The test arrangement as claimed in claim 8, comprising:
   a guide apparatus configured to move the at least one further high-voltage component.

18. The test arrangement as claimed in claim 6, wherein the container comprises a guide rail configured to move the at least one further high-voltage component thereon.

19. The test arrangement as claimed in claim 8, wherein the container comprises a guide rail configured to move the at least one further high-voltage component thereon.

20. The test arrangement as claimed in claim 8, wherein the at least one further high-voltage component is fitted and guided in an upper area of the cuboid container.

21. The test arrangement as claimed in claim 16, wherein the guide apparatus for the at least one further high-voltage component has a drive mechanism.

22. The test arrangement as claimed in claim 17, wherein the guide apparatus for the at least one further high-voltage component has a drive mechanism.

* * * * *